(12) United States Patent
Ding et al.

(10) Patent No.: US 10,115,814 B2
(45) Date of Patent: Oct. 30, 2018

(54) PROCESS METHOD AND STRUCTURE FOR HIGH VOLTAGE MOSFETS

(71) Applicant: Alpha and Omega Semiconductor Incorporated, Sunnyvale, CA (US)

(72) Inventors: Yongping Ding, San Jose, CA (US); Lei Zhang, Shanghai (CN); Hong Chang, Saratoga, CA (US); Jongoh Kim, Sunnyvale, CA (US); John Chen, Palo Alto, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 15/875,932

(22) Filed: Jan. 19, 2018

(65) Prior Publication Data
US 2018/0145167 A1    May 24, 2018

Related U.S. Application Data

(62) Division of application No. 13/892,191, filed on May 10, 2013, now Pat. No. 9,887,283.

(51) Int. Cl.
  *H01L 29/66* (2006.01)
  *H01L 29/78* (2006.01)
  *H01L 21/265* (2006.01)

(52) U.S. Cl.
  CPC .......... *H01L 29/78* (2013.01); *H01L 21/2652* (2013.01); *H01L 21/26586* (2013.01); *H01L 29/66348* (2013.01); *H01L 29/66666* (2013.01); *H01L 29/7827* (2013.01)

(58) Field of Classification Search
  None
  See application file for complete search history.

(56) References Cited

U.S. PATENT DOCUMENTS

| 5,998,836 | A | * | 12/1999 | Williams | H01L 27/0255 257/328 |
| 2004/0150039 | A1 | * | 8/2004 | Henson | H01L 29/0634 257/330 |
| 2005/0006717 | A1 | * | 1/2005 | Yamaguchi | H01L 29/0634 257/500 |
| 2005/0167695 | A1 | * | 8/2005 | Yilmaz | H01L 29/0619 257/134 |
| 2006/0086998 | A1 | * | 4/2006 | Nagaoka | H01L 21/823481 257/500 |
| 2010/0224932 | A1 | * | 9/2010 | Takaya | H01L 29/0623 257/330 |
| 2012/0043602 | A1 | * | 2/2012 | Zeng | H01L 29/0623 257/330 |

* cited by examiner

Primary Examiner — Sitaramarao S Yechuri
(74) Attorney, Agent, or Firm — Bo-In Lin

(57) ABSTRACT

This invention discloses a semiconductor power device disposed in a semiconductor substrate. The semiconductor power device comprises a plurality of trenches each having a trench endpoint with an endpoint sidewall perpendicular to a longitudinal direction of the trench and extends vertically downward from a top surface to a trench bottom surface. The semiconductor power device further includes a trench bottom dopant region disposed below the trench bottom surface and a sidewall dopant region disposed along the endpoint sidewall wherein the sidewall dopant region extends vertically downward along the endpoint sidewall of the trench to reach the trench bottom dopant region and pick-up the trench bottom dopant region to the top surface of the semiconductor substrate.

7 Claims, 7 Drawing Sheets

1 – 1'

2 – 2'

1 – 1'

2 – 2'

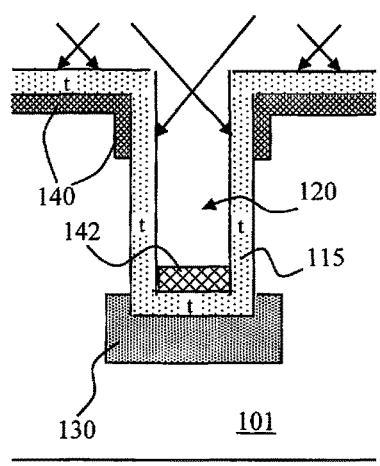 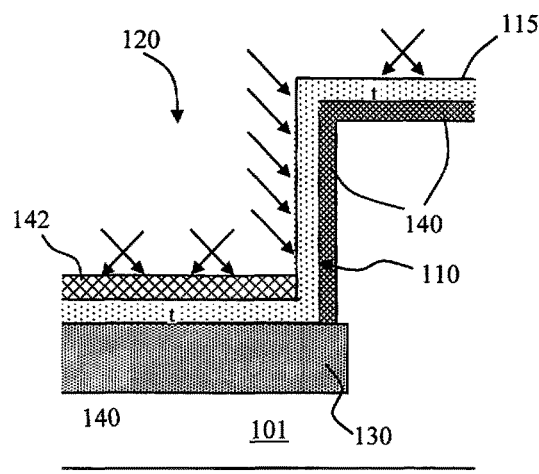
FIG. 2G-1      FIG. 2G-2
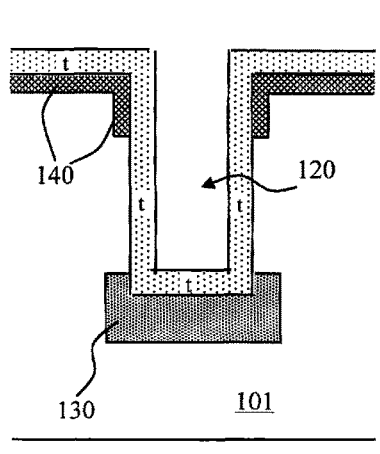 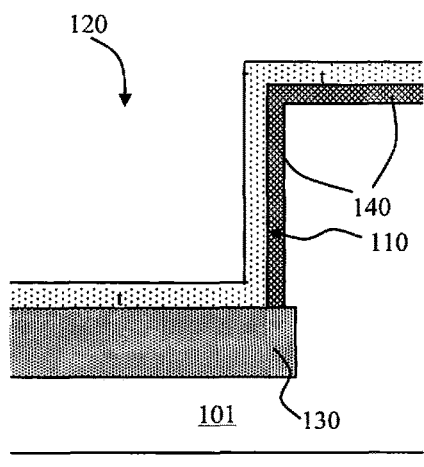
FIG. 2H-1      FIG. 2H-2

PROCESS METHOD AND STRUCTURE FOR HIGH VOLTAGE MOSFETS

CROSS REFERENCE TO RELATED APPLICATION

Under 35 U.S.C. 120, this application is a Divisional Application and claims the priority to U.S. patent application Ser. No. 13/892,191, filed on May 10, 2013, entitled "A PROCESS METHOD AND STRUCTURE FOR HIGH VOLTAGE MOSFETS", which is incorporated herein by reference in its entirety.

BACKGROUND OF THE INVENTION

1. Field of the Invention

The invention relates generally to the manufacturing processes and structures of semiconductor power devices. More particularly, this invention relates to simplified manufacturing processes and structural configurations of improved high voltage (HV) metal oxide semiconductor field effect transistors (MOSFET).

2. Description of the Prior Art

Conventional methods of manufacturing high voltage (HV) MOSFET devices are encountered with difficulties and limitations to further improve the performances due to different tradeoffs. In the vertical semiconductor power devices, there is a tradeoff between the drain to source resistance, i.e., on-state resistance, commonly represented by RdsA, i.e., Rds X Active Area, as a performance characteristic, and the breakdown voltage sustainable of the power device. Several device configurations have been explored in order to resolve the difficulties and limitations caused by these performance tradeoffs. Special P-composition (PCOM) structures are developed particularly to achieve these purposes. Specifically, the high voltage (HV) MOSFET devices implemented with the PCOM configurations include P-type dopant regions surrounding the sidewalls of the shielding trenches to link between the P-type body region formed at the top surface of the semiconductor substrate and a P-type dopant region below the shielding trenches. In order to form the sidewall dopant regions surrounding the trench sidewalls, the conventional methods apply an additional implanting mask with implanting openings to carry out the implantation processes on the trench sidewalls at the selected locations of the shielding trenches. Furthermore, in order to assure the dopant ions are implanted into the bottom portions of the trench sidewalls, implantations of dopant ions at high energy must be applied. The requirements of additional mask and the processes of applying high energy dopant ions cause the increase of the manufacturing costs. Additionally, high energy implantations into the bottom portions of the trench sidewalls followed with a diffusion process generally have less control of the formation of the dopant regions. These uncertainties of the manufacturing processes result in greater variations of device performance and less accurate control of the manufacturing qualities.

FIG. 1A is a top view of an implanting mask 100 used in the conventional process and FIGS. 1B and 1C are two cross sectional views illustrating the configurations of a high voltage (HV) MOSFET device formed by applying conventional process along lines 1-1' and 2-2' of FIG. 1A correspondingly. As shown in FIG. 1A, the implanting openings 11 are located on the selected regions of the trenches 12. In order to form a MOSFET device that can sustain high power operations, a PCOM (P-composition) configuration is formed. In this PCOM MOSFET structure, special dopant regions are formed in part of the areas 16 below the P-type body region 13 through the implanting openings 11 to link the P-type body region and a P-type dopant region 15 below the trench 12 as shown in FIG. 1C. Meanwhile, in other areas, the implantation forming the dopant regions below the body regions is blocked by the implanting mask 100. The implant mask shown in FIG. 1A blocks the dopant implanted through the sidewalls of the trench in areas around 1-1'. FIG. 1B shows a configuration where there are no dopant regions surrounding the trench sidewalls to link the body regions and the dopant regions below the trench bottom.

The conventional manufacturing processes as shown in FIGS. 1A to 1C requires an additional implanting mask. Furthermore, a high energy implant of P-type dopant, e.g., P-type dopant implant in the Mev ranges, is required to form the dopant regions below the body regions surrounding the trench sidewalls shown in FIG. 1C. The manufacturing costs are increased due to the additional mask and high energy implant requirements.

Therefore, a need still exists for the ordinary skill in the art to improve the methods of manufacturing of the power devices, particularly the devices with the PCOM configuration to resolve these technical limitations. It is the purpose of this invention to provide new and improved methods of manufacturing and device configurations to eliminate the requirements of additional implanting mask and high energy implantations such that the above-discussed difficulties and limitations can be overcome.

SUMMARY OF THE PRESENT INVENTION

It is therefore an aspect of the present invention to provide a new and improved method of manufacturing for implanting the trench sidewall type dopant regions without requiring an additional implanting mask and without requiring a high energy dopant implant such that the cost of manufacturing can be reduced, whereby the above discussed limitations and difficulties can be resolved.

Specifically, it is an aspect of this invention that the implanting process takes advantage of the special configuration of the sidewalls at the trench endpoints where the sidewall perpendicular to the longitudinal direction of the trench is inherently exposed to open space as part of the trenches. Therefore, a P-type dopant region implanted through this endpoint sidewall can be carried out to reach the bottom P-type dopant region formed at the bottom of the trench without requiring the application of high energy dopant ions because the dopant ions are projected only through open space of the trenches without requiring penetrating through the semiconductor substrate. The PCOM dopant regions linking the P-type body regions formed at the top surface of the semiconductor substrate and the trench bottom P-type dopant regions are therefore formed only at the sidewalls of the trench endpoint. In contrast to the conventional methods, cost savings are achieved without requiring a high energy dopant implant.

It is another aspect of this invention that the sidewall dopant implant through the open space along the longitudinal direction of the trench onto a trench sidewall at the trench endpoint provides better control over the implanting process. The device performance parameters are more accurately controllable and manufacturing variations caused by uncertainties due to high energy dopant implant to penetrate through substrate are reduced.

In a preferred embodiment, this invention discloses a semiconductor power device disposed in a semiconductor substrate. The semiconductor power device comprises a plurality of shielding trenches formed at the top portion of the semiconductor substrate each having a trench endpoint with an endpoint sidewall perpendicular to a longitudinal direction of the trench and extends vertically downward from a top surface to a trench bottom surface. The semiconductor power device further includes a trench bottom P-type dopant region disposed below the trench bottom surface and a sidewall P-type dopant region disposed along the endpoint sidewall wherein the sidewall P-type dopant region extends vertically downward along the endpoint sidewall of the trench to reach the trench bottom P-type dopant region and connect the trench bottom P-type dopant region to a P-type body region formed at the top surface of the semiconductor substrate.

In a preferred embodiment, this invention further discloses a method for manufacturing a semiconductor power device on a semiconductor substrate. The method includes a step of a) applying a hard oxide mask atop a semiconductor substrate followed by patterning the hard oxide mask according to a pre-determined trench configuration; b) etching through the patterned hard mask to form a plurality of trenches at the top portion of the semiconductor substrate each having a trench endpoint with an endpoint sidewall perpendicular to a longitudinal direction of the trench with the endpoint sidewall extends vertically downward from a top surface to a trench bottom surface; c) applying a vertical (zero degrees) high energy implant to form trench bottom P-type dopant regions below the trench bottom surface followed by removing the hard mask; d) growing an oxide liner atop the silicon surface at the sidewall and bottom of the trenches; and e) applying a low energy tilt implant wherein dopant ions are implanted along a designated tilt angle to form a sidewall P-type dopant region along the endpoint sidewall, where the sidewall P-type dopant region extends vertically downward along the endpoint sidewall of the trench to reach the trench bottom P-type dopant region and connect the trench bottom P-type dopant region to a P-type body region formed at the top surface of the semiconductor substrate. In one of the embodiments, the dopant ions are implanted along a tilt angle approximately 45 degrees relative to the sidewall surfaces.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 2F-1 and 2F-2 are side cross sectional views showing an alternative embodiment of FIGS. 2B-1 and 2B-2.

FIGS. 2G-1, 2G-2, 2H-1 and 2H-2 are side cross sectional views showing another alternative embodiment of FIGS. 2E-1 and 2E-2.

DETAILED DESCRIPTION OF THE METHOD

Figure 1A:
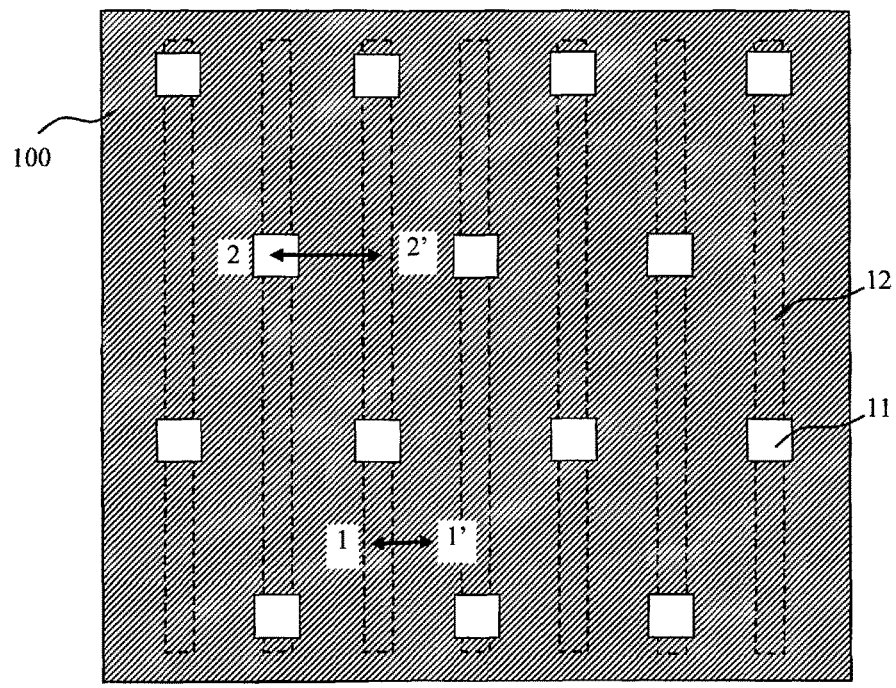
FIG. 1A is a top view of an implanting mask used in conventional process and FIGS. 1B and 1C are two side cross sectional views of the PCOMP configurations along two different locations across the trench corresponding to those shown on the implanting mask 100 of FIG. 1A.
Figure 1B:
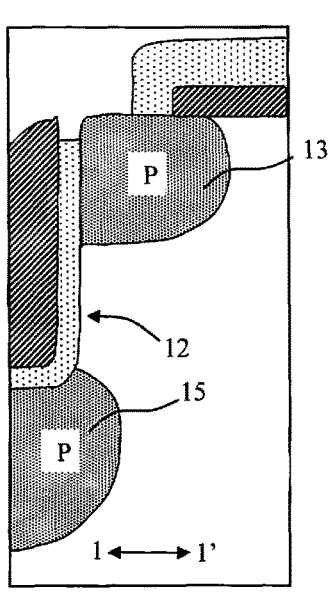
Figure 1C:
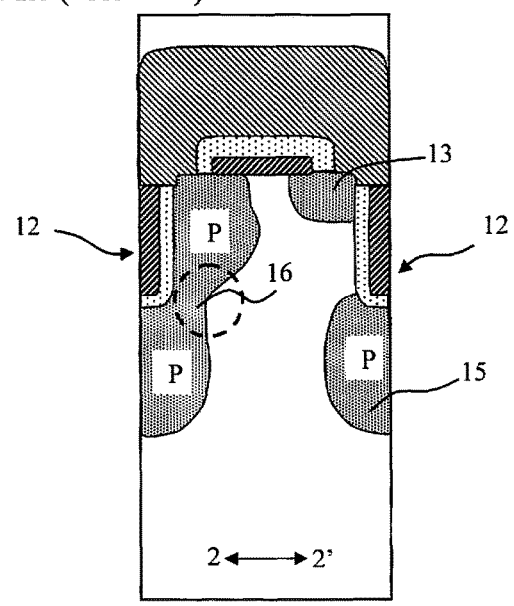
Figure 2A:
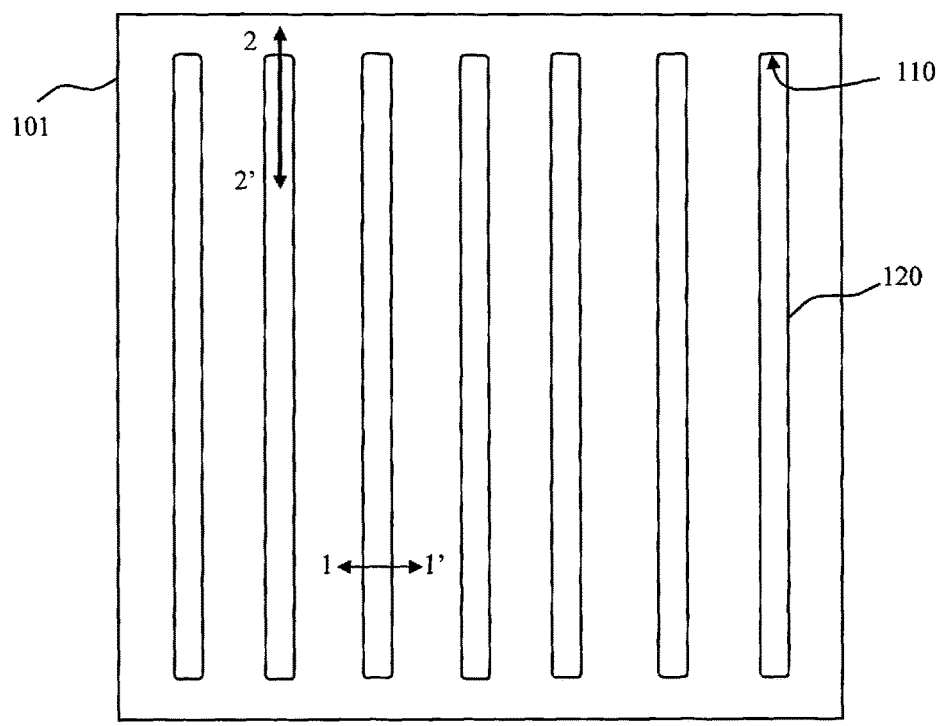
FIG. 2A is a top view of a conventional trench configuration on a semiconductor substrate.

FIG. 2A is a top view of a conventional trench configuration on a semiconductor substrate. FIGS. 2B, 2C-1, 2C-2, 2D-1, 2D-2, 2E-1, 2E-2, 2F-1, 2F-2, 2G-1, 2G-2, 2H-1 and 2H-2 are side cross sectional views illustrating the processing steps of forming the PCOM structural configuration along the line 1-1' and line 2-2' in FIG. 2A respectively in different embodiments of the present invention.

Figure 2B:
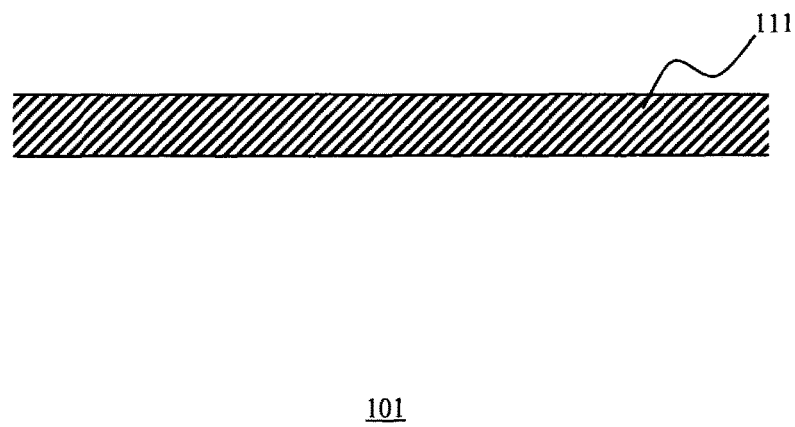
FIGS. 2B, 2C-1, 2C-2, 2D-1, 2D-2, 2E-1, 2E-2 are side cross sectional views showing some steps of the process to form a PCOMP configuration at two different locations of the trench of the present invention.

As shown in FIG. 2A, a plurality of trenches 120 are formed on a semiconductor substrate 101 with each trench 120 having a trench endpoint sidewall 110. The plurality of trenches 120 can be formed as follow: an oxide hard mask 111 is deposited atop the semiconductor substrate as shown in FIG. 2B; then the hard mask 111 is patterned according to a pre-determined configuration similar as the that shown in FIG. 2A; and the semiconductor substrate 101 is then anisotropically etched out through the patterned hard mask 111 to form the a plurality of trenches 120 with each trench 120 having trench endpoints 110 as shown in FIGS. 2C-1 and 2C-2.

Figures 1, 2C:
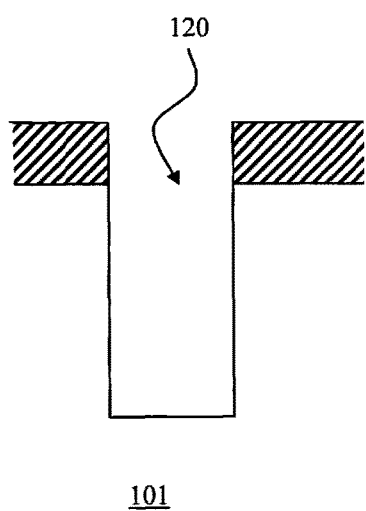
Figures 2, 2C:
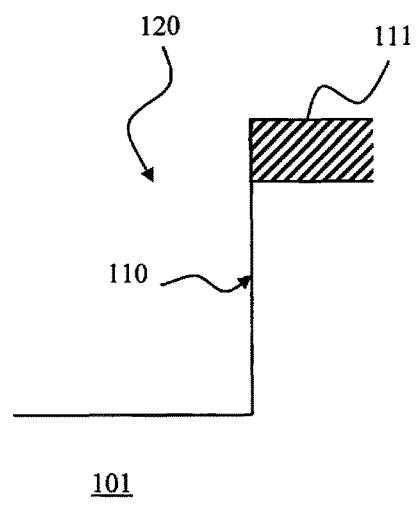
Figures 1, 2, 2D:
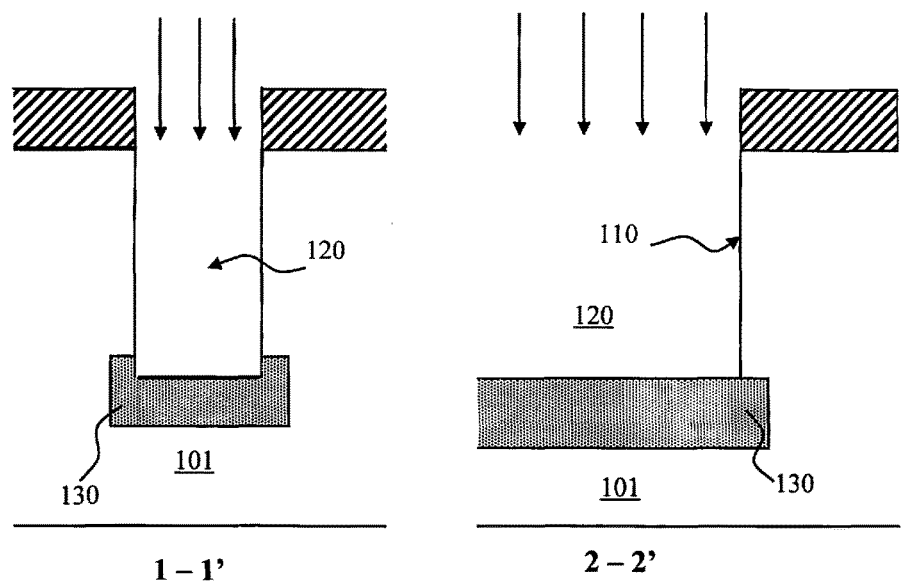

A vertical high energy P-type dopant implantation (zero degrees) is first carried out, through the patterned hard mask 111, to form the P-type dopant regions 130 below the bottom surface of the trench 120 as shown in FIGS. 2D-1 and 2D-2. The P-type dopant regions 130 function as RESURF at trench bottom for providing a maximum BV (break down voltage) blocking capability.

Figures 1, 2E:
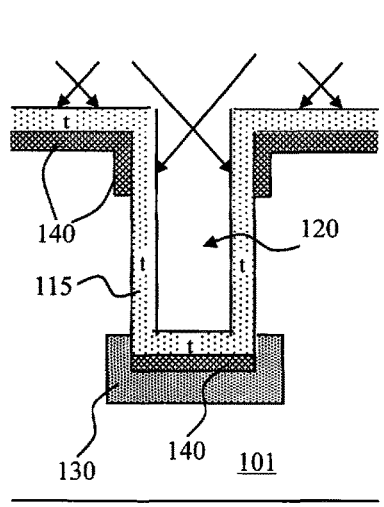
Figures 2, 2E:
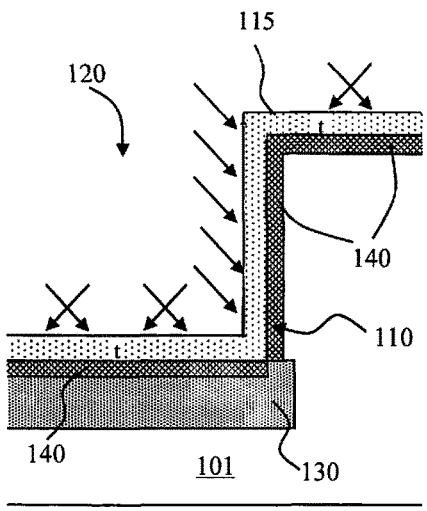

As shown in FIGS. 2E-1 and 2E-2, the hard mask 111 is removed and then a thin oxide layer 115 is deposited on the top surface of the substrate 101, on the sidewalls and the bottom surface of the trench 120 and at the endpoint sidewall 110 with a same thickness shown as t. Then a low energy tilt P-type dopant implantation, for example at 45 degrees, is carried out. In FIG. 2E-1, the P-type dopant regions 140 are formed at the top surface of the substrate, below the bottom surface of the trench 120 and only at the top portions surrounding the trench sidewalls. In FIG. 2E-2, the tilt implantation is also carried out at the endpoint sidewall 110 at the endpoints of the trenches 120, thus the P-type dopant regions 140 are now formed along the entire length of the trench endpoint sidewalls 110, below the bottom surface of the trench 120 and at the top surface of the substrate 101. The PCOMP structural configurations is achieved with the P-type dopant regions 140 formed along the entire length of the trench endpoint sidewalls 110 that link the P-body regions (not shown) to the bottom P-type dopant regions 130 without requiring additional implant mask and without requiring a high energy implantation. The manufacturing process proceeds with standard processing steps to complete the devices.

Figures 1, 2F:
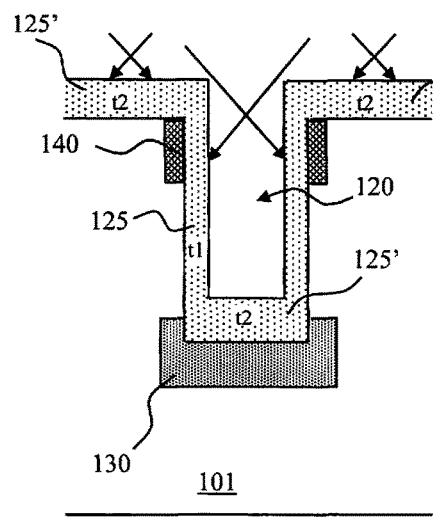
Figures 2, 2F:
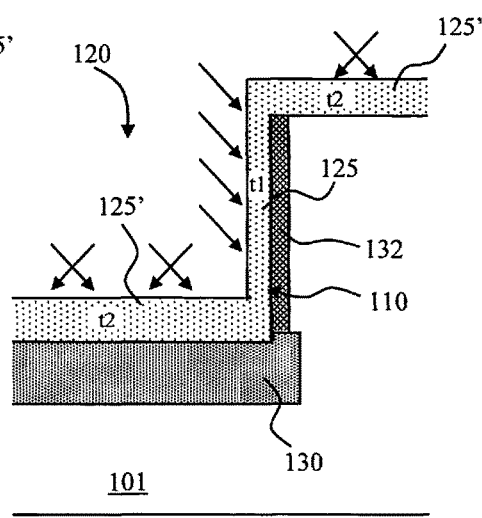

In FIGS. 2E-1 and 2E-2, as described above, a thin oxide layer 115 with a uniform thickness t is deposited on the top surface of the substrate 101 and on the sidewalls and the bottom surface of the trenches 120 and the endpoint sidewall 110. FIGS. 2F-1 and 2F-2 are side cross sectional views similar to that of FIGS. 2E-1 and 2E-2. In this embodiment, the oxide layer 125' deposited at the top surface of the substrate 101 and at the bottom surface of the trench 120 has a thickness t2 greater than the thickness t1 of the oxide layer 125 covering the sidewalls of the trench 120 and the trench endpoint sidewall 110. The thickness t2 of the oxide layer 125' is thick enough to block the implantation at the top surface of the substrate 101 and below the bottom surface of the trench 120. As a result, after the low energy tilt angle implantation is carried out, as shown in FIG. 2F-1, the P-type dopant regions 140 are only formed at the top portions surrounding the sidewalls of the trenches 120. In FIG. 2F-2, the P dopant regions 140 are only formed along the entire length of the trench endpoint sidewalls 110. As such, the PCOMP structural configurations is achieved with the dopant regions 140 formed along the entire length of the trench endpoint sidewalls 110 that links the P-type body regions formed at the top surface of the semiconductor substrate (not shown) to the bottom P-type dopant regions 130 without requiring an additional implant mask and without requiring a high energy implantation. The manufacturing process proceeds with standard processing steps to complete the devices.

In an alternative embodiment, if a thin oxide layer 115 with a uniform thickness t is deposited on the top surface of the substrate 101 and on the sidewalls and the bottom surface of the trenches 120 and the endpoint sidewall 110 similar to that shown in FIGS. 2E-1 and 2E-2, to prevent the tilted implantation punching through the oxide layer at the bottom of the trench 120, before the tilted implantation is carried out, a layer of sacrificial materials 142 is deposited at the bottom of the trench 120 in certain controlled thickness as shown in FIGS. 2G-1 and 2G-2. The layer 142 can be high-density plasma (HDP) oxide photoresist, TEOS and the likes. As a result, after the low energy tilt angle implantation is carried out, as shown in FIG. 2G-1, the P-type dopant regions 140 are only formed at the top portions surrounding the sidewalls of the trenches 120 and at the top surface of the semiconductor substrate 101, and in FIG. 2G-2, the P dopant regions 140 are only formed along the entire length of the trench endpoint sidewalls 110 and at the top surface of the semiconductor substrate 101. The sacrificial material layer 142 is then removed as shown in FIGS. 2H-1 and 2H-2 before the trench 120 is filled with polysilicon in a next processing step. The manufacturing process proceeds with standard processing steps to complete the devices.

Figures 3A, 3B:
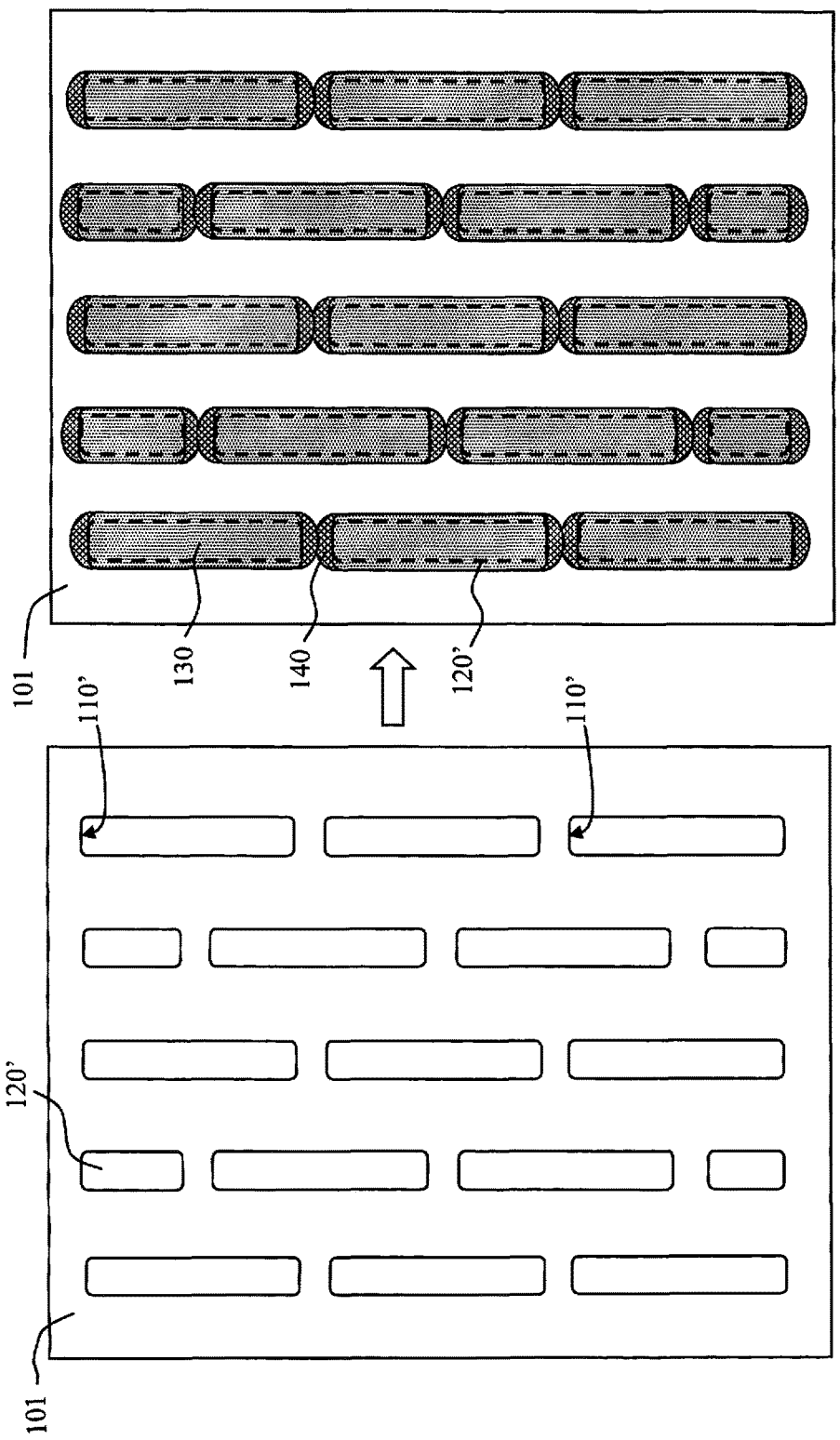
FIG. 3A is a top view of an alternate configuration of trenches of various lengths on a semiconductor substrate of the present invention.
FIG. 3B is a top view of the semiconductor substrate after the vertical and tilt implantations to form a PCOMP configuration.

FIGS. 3A-3B show an alternative embodiment of the present invention. As shown in FIG. 3A, which is a top view of an alternate trench configuration on a semiconductor substrate 101 of the present invention, the length of the trenches 120' are adjusted by providing trench endpoints at predesigned areas, for example the length of trenches 120' is shorter than that of trenches 120 shown in FIG. 2A, thus the density of the trench endpoint sidewalls 110' and so as the density of the PCOMP structural configurations is adjusted, thus the PCOMP structural configurations with the P-type dopant regions formed along the entire length of the trench endpoint sidewalls that links between the P-type body regions formed at the top surface of the semiconductor substrate to the trench bottom P-type dopant regions are distributed over entire area of the semiconductor substrate. FIG. 3B is a top view of the semiconductor substrate 101 after the implantation is carried out using the implantation processes described above forming PCOMP structural configurations. As shown in FIG. 3B, the vertical implantation of the P-type dopant through the trench hard mask forms the P-type dopant regions 130 below the bottom surface of the trench 120' and the tilt angle P-type dopant implantation at the trench endpoint sidewalls 110' forms the P-type dopant regions 140 along the entire length of the trench endpoint sidewalls 110'. Depending on the space between two endpoints of two adjacent trenches 120', the P-type dopant regions 140 can be merged together, as shown in FIG. 3B, or can be separated from each other (not shown).

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a semiconductor power device on a semiconductor substrate comprising:

depositing a hard mask atop the semiconductor substrate and patterning the hard mask according to a pre-determined trench configuration;

etching the semiconductor substrate through the patterned hard mask to form a plurality of trenches in the top portion of the semiconductor substrate each having a trench endpoint with an endpoint sidewall perpendicular to a longitudinal direction of the trench with the endpoint sidewall extends vertically downward from a top surface to a trench bottom surface;

applying vertical high energy implant to form trench bottom dopant regions below the trench bottom surface followed by removing the hard mask;

depositing an insulation layer for covering trench sidewalls and an insulation layer for covering the trench bottom surfaces;

applying a low energy tilt implant to form a sidewall dopant region along the endpoint sidewall wherein the sidewall dopant region extends vertically downward along the endpoint sidewall of the trench to reach the trench bottom dopant region to pick-up the trench bottom dopant region to the top surface of the semiconductor substrate; and forming at least two of the endpoint sidewall body dopant regions in at least two of the endpoint sidewalls that are immediately adjacent to each other as adjacent endpoint sidewall body dopant regions with the adjacent endpoint sidewall body dopant regions extend through an entire semiconductor region between at least two of the endpoint sidewalls and merging the adjacent endpoint sidewall body dopant regions into a joined endpoint sidewall body dopant region to extend vertically downward along an entire length of the endpoint sidewalls of the adjacent trenches to reach and directly contact the laterally extended region of the trench bottom body dopant region.

2. The method of claim 1 wherein the step of depositing the insulation for covering the trench sidewalls and the trench bottom surfaces further comprising a step of depositing the insulation layer covering the trench sidewalls and the insulation layer covering the trench bottom surfaces have approximately a same thickness.

3. The method of claim 1 wherein:
the step of depositing the insulation for covering the trench sidewalls and the trench bottom surfaces further comprising a step of depositing the insulation layer covering the trench sidewalls has a smaller layer thickness than the insulation layer covering the trench bottom surface.

4. The method of claim 1 wherein:
the step etching the semiconductor substrate through the patterned hard mask to form a plurality of trenches in the top portion of the semiconductor further comprising a step of forming each trench to extend between two pre-designated locations with the trenches have different lengths.

5. The method of claim 1 wherein:
the step etching the semiconductor substrate through the patterned hard mask to form a plurality of trenches in the top portion of the semiconductor further comprising a step of forming each trench to extend between two pre-designated locations with the trenches have different lengths and wherein the trench endpoints are distributed at the designated locations on the entire surface of the semiconductor substrate.

6. The method of claim 1 further comprising:
manufacturing the semiconductor power device as a high voltage (HV) MOSFET device.

7. The method of claim 1 further comprising:
manufacturing the semiconductor power device as a high voltage (HV) IGBT.

\* \* \* \* \*